United States Patent
Lauffer et al.

(10) Patent No.: US 6,252,179 B1
(45) Date of Patent: Jun. 26, 2001

(54) ELECTRONIC PACKAGE ON METAL CARRIER

(75) Inventors: John M. Lauffer, Waverly; Kostantinos I. Papathomas, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/246,529

(22) Filed: Feb. 8, 1999

Related U.S. Application Data

(60) Continuation-in-part of application No. 08/811,077, filed on Mar. 3, 1997, now Pat. No. 5,867,898, which is a division of application No. 08/429,612, filed on Apr. 27, 1995, now Pat. No. 5,670,750.

(51) Int. Cl.$^7$ ....................................... H01R 9/09
(52) U.S. Cl. ......................... 174/263; 174/255; 174/258
(58) Field of Search .................... 174/255, 260, 174/262, 263, 264, 265, 252, 256, 258; 361/792, 793, 794, 795

(56) References Cited

U.S. PATENT DOCUMENTS

| | | | |
|---|---|---|---|
| 4,396,936 | * 8/1983 | McIver et al. | 357/81 |
| 4,993,148 | 2/1991 | Adachi et al. | 29/832 |
| 4,999,740 | 3/1991 | Hardi et al. | 361/386 |
| 5,079,065 | * 1/1992 | Masakazu et al. | 428/137 |
| 5,081,562 | 1/1992 | Adachi et al. | 361/386 |
| 5,416,278 | * 5/1995 | Ostrem et al. | . |
| 5,497,545 | * 3/1996 | Watanabe et al. | . |
| 5,519,176 | * 5/1996 | Goodman et al. | . |
| 5,539,618 | * 7/1996 | Wiesa et al. | 361/720 |
| 5,670,750 | 9/1997 | Lauffer et al. | 174/262 |
| 5,736,681 | * 4/1998 | Yamamoto et al. | . |

* cited by examiner

*Primary Examiner*—Jeffrey Gaffin
*Assistant Examiner*—Kamand Cuneo
(74) *Attorney, Agent, or Firm*—Patrick J. Daugherty; Driggs, Lucas, Brubaker & Hogg Co., LPA

(57) ABSTRACT

An electronic circuit package includes a metal carrier, a first dielectric layer of an epoxy glass material, a first electrically conductive circuit layer, a second dielectric layer, a second electrically conductive circuit layer and an electrical interconnection between the first and second electrically conductive circuit layers. The electronic circuit package affords improved electrical breakdown resistance.

18 Claims, 2 Drawing Sheets

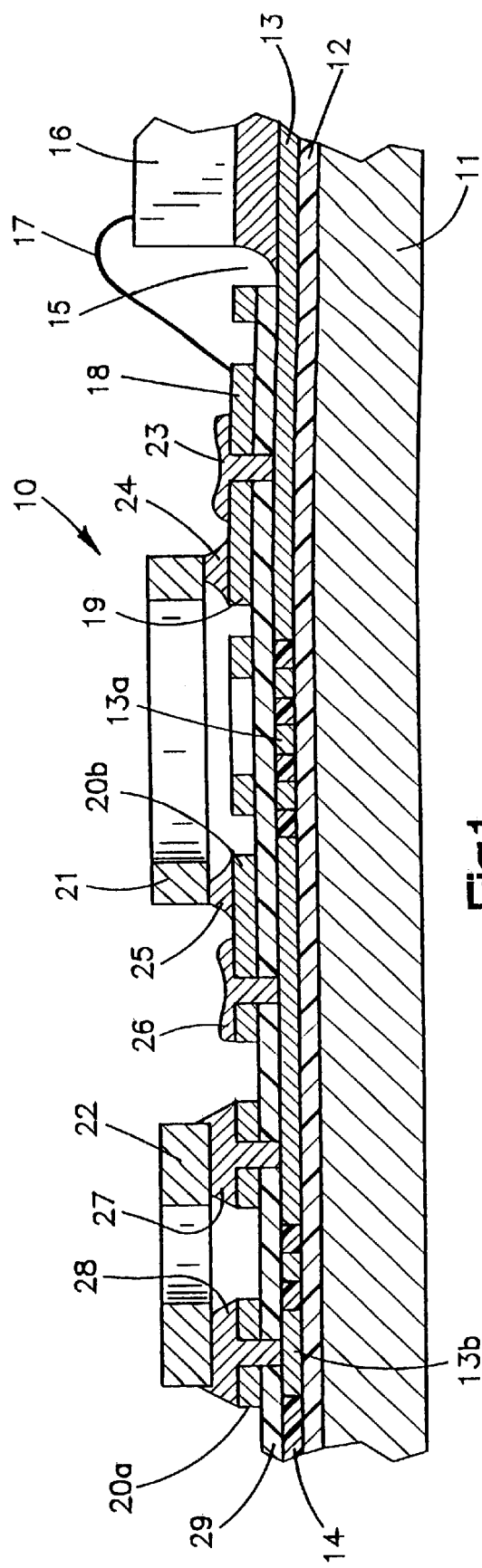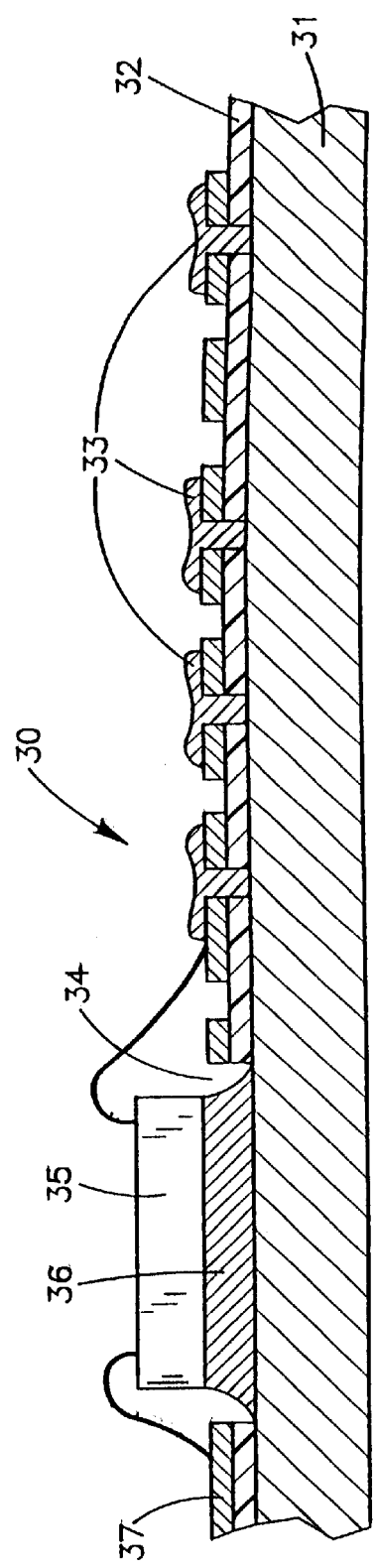

ELECTRONIC PACKAGE ON METAL CARRIER

CROSS REFERENCE TO APPLICATION

This application is a Continuation in Part of Ser. No. 08/811,077, filed Mar. 3, 1997, now U.S. Pat. No. 5,867,898, issued Feb. 9, 1999, which is a divisional application of Ser. No. 08/429,612, filed Apr. 27, 1995, now U.S. Pat. No. 5,670,750, issued Sep. 23, 1997.

FIELD OF THE INVENTION

The present invention relates to electrical circuit cards and their manufacture.

BACKGROUND OF THE INVENTION

Circuit boards today are still called "printed circuit boards", even though such boards seldom are "printed". Regardless of how made, these must conform to stringent safety requirements with respect to operating voltages, dielectric breakdown voltages, and the ability to dissipate heat during operating conditions, etc.

When these safety requirements call for ability to operate under voltages of at least 2500 volts, this dictates minimum dielectric thicknesses, which often present heat dissipation problems. Of course, cooling by forced air or water can be provided, but this arrangement causes other problems.

U.S. Pat. No. 4,993,148 to Adachi et al. describes a method for forming a circuit board that involves plating conductor layers on a pre-defined dielectric layer that leaves a portion of the conductor exposed for mounting components. This method involves applying a copper foil, defining a conductor and via pattern in the copper foil and then using the conductor and via pattern to define the dielectric.

U.S. Pat. No. 4,999,740 to Ilardi et al. describes a circuit board made by building a layer of photo-imageable dielectric material on a metal substrate and imaging the dielectric to create wells for mounting components on the metal substrate. This patent does not involve multiple wiring layers.

U.S. Pat. No. 5,081,562 to Adachi et al. describes a circuit board with a metal plate on which a photo-sensitive insulating layer is formed leaving portions of the metal plate exposed for component mounting areas. The circuit board requires copper plating of conductors and vias.

U.S. Pat. No. 5,670,750 to Lauffer et al. describes a circuit card which includes a substrate formed of a metal carrier having a dielectric material on at least one surface to support an electronic card of a predetermined configuration. Selected areas of the electronic card have portions removed for mounting components called for by the circuit arrangement and the operating requirements. The substrate comprises a metal carrier on which a first dry film dielectric layer is formed, dried, and cured. The dry film dielectric can also be a liquid dielectric that is screen printed and dried on the surface of the metal carrier.

The patents identified above are incorporated herein by reference.

The present invention permits use of a very cost-efficient manufacturing process, namely, a process wherein copper plating of conductors is eliminated. This advantage is even more significant in the manufacture of power circuit cards that involve thicker copper and require more manufacturing time. Such an invention is considered a significant advancement in the art.

A further advantage that is significant with the circuit card arrangement of the present invention is in its elimination of the usual requirement of copper plating, which permits higher wiring densities to be obtained.

Yet another advantage of the present invention is obtained by the use of thin coatings for the materials of high dielectric breakdown strength, which thin materials also provide a minimal thermal resistance. When used in conjunction with openings in the dielectric for component mounting, a more effective heat dissipating circuit card structure results.

OBJECTS AND SUMMARY OF THE INVENTION

It is a principal object of the present invention to provide a new and improved circuit package that overcomes deficiencies inherent in many known packages.

It is also an object of the invention to provide a new and improved method of manufacturing such a package.

According to one aspect of the invention, there is provided an electronic circuit package comprising a metal carrier having high thermal conductivity properties, a first dielectric layer comprised of a substantially cured resin glass material positioned on the metal carrier to provide electrical insulation, a first electrically conductive circuit layer positioned on the first dielectric layer, a second dielectric layer positioned on the first electrically conductive circuit layer and comprised of a substantially imaged photoimageable dielectric including at least one via therein, a second electrically conductive circuit layer having a predetermined pattern positioned on the second dielectric layer, and at least one electrical interconnection between the first and second electrically conductive circuit layers, the electrical interconnection occurring through the via.

According to another aspect of the invention, there is provided a method of making an electronic circuit package comprising the steps of providing a metal carrier having high thermal conductivity properties, forming a first dielectric layer comprised of a substantially cured resin glass material positioned on the metal carrier to provide electrical insulation, forming a first electrically conductive circuit layer positioned on the first dielectric layer, forming a second dielectric layer positioned on the first electrically conductive circuit layer and comprised of a substantially imaged photoimageable dielectric including at least one via therein, forming a second electrically conductive layer having a predetermined pattern positioned on the second dielectric layer, and forming at least one electrical interconnection between the first and second electrically conductive circuit layers through the via.

The above and other objects, advantages and features of the present invention will become more readily apparent from the following detailed description of the presently preferred embodiment as illustrated in the accompanying drawings.

BRIEF DESCRIPTION OF THE DRAWINGS

FIG. 1 is an elevational view, in section, of one embodiment of the present invention.

FIG. 2 is another elevational view, in section, of another embodiment of the present invention.

BEST MODE FOR CARRYING OUT THE INVENTION

Figure 3:
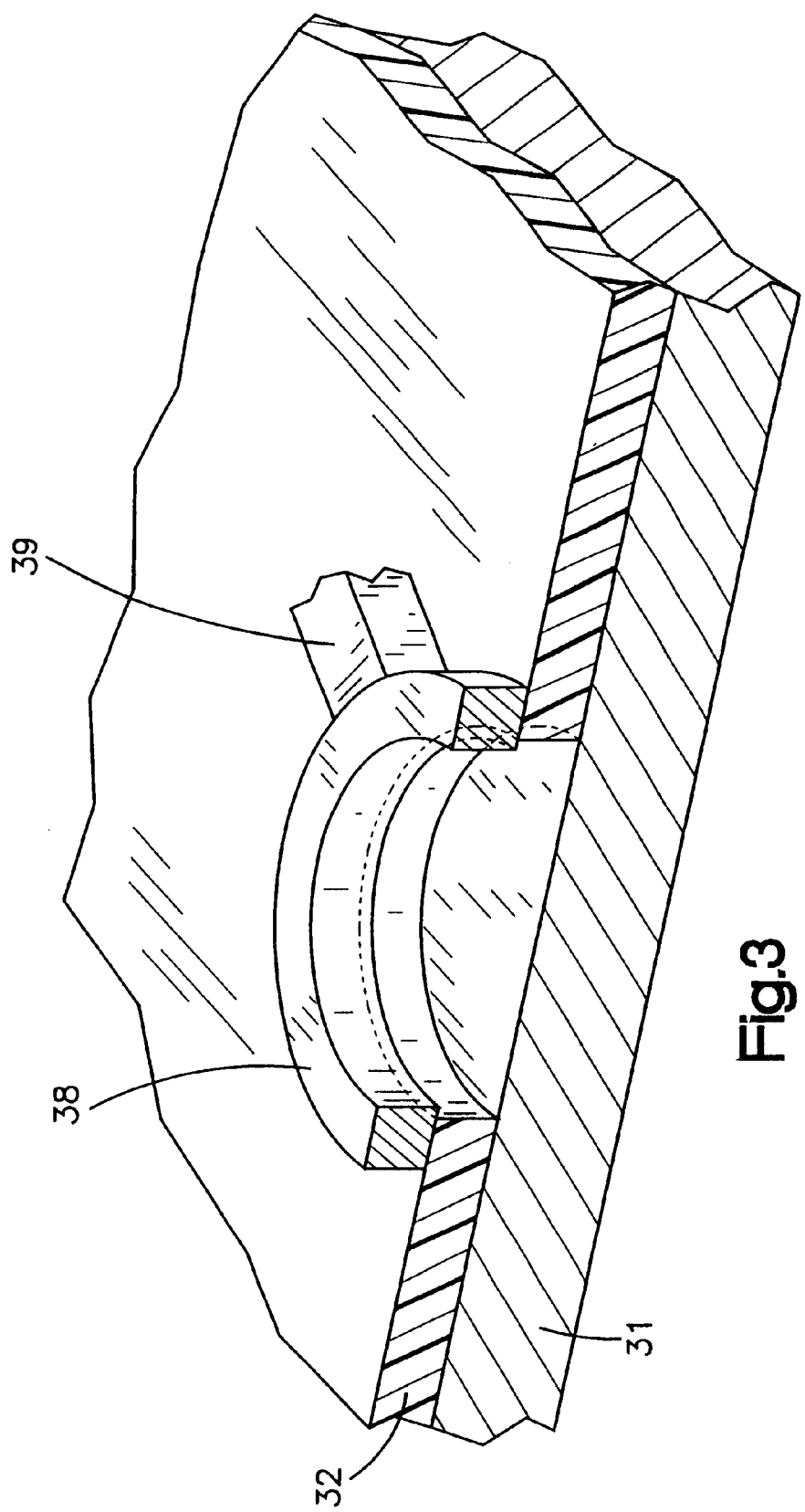
FIG. 3 is a partial perspective view, partly in cross section, illustrating the unique configuration of a metallic land for use with the invention.

In FIG. 1 of the drawings, the numeral 10 identifies, generally, an electronic package in accordance with the invention. Package 10 features a metal carrier 11 on which a first dielectric layer 12 is formed.

For first dielectric layer 12, an epoxy based resin with a reinforcing material is applied by lamination or other means known in the art to metal carrier 11. The resin material is selected from a group including epoxy, cyanate or bismaleimide resins or combinations thereof. Examples of epoxy resins used in this invention include epoxy polymer resins such as epoxidized novolac polymers and polyepoxides from haloepoxy alkane polymers derived from mononuclear and polynuclear dihydric and halogenated dihydric phenols. Mixtures of epoxides can also be used. Further examples of suitable epoxides containing an oxirane ring that can be employed are known and described in: E. W. Flick, "Epoxy Resin, Curing Agents, Compounds, and Modifiers" Noyes Publication, Park Ridge, J.J. (1987); in Lee and Neville, "Epoxy Resins" McGraw-Hill, (1967); and in U.S. Pat. No. 4,680,341.

Typical commercially available epoxidized novolac polymers suitable for use in the present invention are sold under the product names ECN 1235, ECN 1278, ECN 1280, and ECN 1299 by Ciba Corporation, Epon 1031, Epon SU-3, Epon SU-8, and Epon 160 from Shell Chemical Corporation and DEN 431, DEN 438 and DEN 485 from Dow Chemical Corporation.

Typical commercially available diglycidyl ether polyepoxides suitable for use in the present invention are sold under the product names: Araldite GY 6008 and Araldite GY 6010, by Ciba Corp., Epon 826, Epon 828, Epon 830 and Epon 834 available from Shell Chemical Corporation and DER 331, DER 332, and DER 334 from Dow Chemical Corporation.

Typical commercially available brominated epoxy resins suitable for use in the present invention include those sold under the product names Araldite LZ 9302, Araldite LZ 8001, Araldite LT 8049, and Araldite AER 8018, by Ciba Corporation and Epon 1163 and Epon 1183 by Shell Chemical Corporation.

In addition, the polyepoxides of haloepoxy alkane and a polynuclear dihydric phenol can be employed. The preferred polyepoxides of this class are the polyepoxides of epichlorohydrin and bisphenol A such as 2,2'-bis(p-hydroxyphenyl) propane.

Examples of cyanate resins used in this invention include polyfunctional cyanate ester monomers having the formula R—(0—C≡N)$_m$, where m=2–5 and R is an aromatic organic group, the cyanate groups being bonded to an aromatic ring of the aromatic organic group.

In addition, the cyanate esters used herein can be blended with organic monomers or polymers including oligomers. The polymers can be thermoplastic or thermosetting. Examples or organic modifiers are epoxies, alkylesters, acetylene terminated resins, multifunctional maleimide resins, monofunctional or multifunctional phenols, polyols, polyethermides, polyimides, polyimidesiloxanes, fluorine containing polyimides, polyesters, polyacrylates, polysulfones, polyethersulfones, polycarbonates, polyestercarbonates and acrylonitrile-butadiene-styrene polymers.

The bismaleimide resins used in this invention are preferably comprised of polyfunctional maleimide resins.

When a maleimide resin is employed, it is desirable to employ a heat-sensitive free radical initiator in order to facilitate the curing. Suitable free radical initiators include peroxides such as dicumyl peroxide and tert-butyl perbenzoic peroxide and azobisisobutyronitrile. When employed, the free radical initiator is present in amounts up to about 0.5 percent by weight and preferably about 0.005 percent to about 0.2 percent by weight based upon the amount of maleimide resin in the composition. Commercial biscyanate/bismaleimide mixtures are known as BT resins, and are available from Mitsubishi Gas Chemical Co. Inc., Japan. One such BT resin is marketed by Mitsubishi under the product name MGC 2060B.

The reinforcing material of the first dielectric layer can be selected from the group of organic woven fibers, organic non-woven fibers, inorganic woven fibers or inorganic non-woven fibers or combinations thereof. Examples of fibers operable in this invention are E-glass (electrical grade glass), S-glass (high strength glass), quartz (quartz fabrics are woven from yarn produced from high purity crystalline SiO$_2$), low dielectric fabrics such as D-glass (low dielectric constant glass), aramids such as Kevlar and Nomex, (both registered trademarks of E.I. DuPont de Nemours and Co.), poly-p-phenylene benzobisthiazole, p-phenylene benzobisoxazole, polyetheretherketone, aromatic polyesters, polytetrafluoroethylene, and the like.

The thickness of first dielectric layer 12, required to provide adequate insulation at 2500 volts, is a thickness of about 0.002 inch to about 0.004 inches. This dielectric thickness provides for the use of a material with relatively poor thermal conductivity properties, (as low as 0.2 watts per meter-degree Kelvin), while still providing minimal application thermal resistance of less than 3 degrees Centigrade© per watt. In the invention, the application thermal resistance may be reduced to about only 0.5 degrees C. per watt, or less, by selective removal of the dielectric material.

On first dielectric layer 12, a first layer of about 2 ounces (oz.) copper foil (not shown before circuitization) is laminated by the application of temperature and pressure in a lamination press. It is during the lamination that the first layer of copper foil is adhered to the dielectric material and the dielectric material becomes cured.

This first layer of copper foil is formed into first electrically conductive circuit layer 13 of a desired pattern by a conventional subtractive etching process to form, for example, a first voltage source and a second voltage source and signal circuit lines 13a and 13b also in FIG. 1.

A dielectric layer 14 of a photo-imageable dielectric is formed on first electrically conductive circuit layer 13. A vacuum laminator has been found to be the better apparatus for applying dielectric layer 14, since it is important in the manufacturing process that fabrication costs be controlled.

The dielectric layer 14, when formed in accordance with the invention, is dried, exposed, developed and substantially cured in a pattern that leaves dielectric material between the circuit lines of the first electrically conductive circuit layer 13. Forming dielectric layer 14 in accordance with the method of this invention removes dielectric material from the top surface of the circuit lines in first electrically conductive circuit layer 13, thereby forming a planar surface on which components may be mounted, additional circuit lines formed, and connections made, as will be described.

A modification of the process for applying dielectric layer 14 is to pattern screen print a liquid dielectric material directly between the circuit lines of first electrically conductive circuit layer 13. The pattern screen printing process eliminates the expose and develop process steps typically required when a film dielectric material is used.

A second dielectric layer 29, a photoimageable dielectric, is applied to the planarized structure, followed by lamination of a second copper foil layer which forms a second electrically conductive circuit layer 19.

A significant improvement in performance has resulted from use of the present invention. For example, in a previously known structure, a circuit board was tested at a continuous exposure of 105 degrees C. and 600 volts bias. Dielectric breakdown at the first dielectric layer 12 occurred in approximately 50% of the tested boards in less than 2000 hours. A tested board of the present invention has exceeded 8000 hours of continuous exposure to 105 degrees Centigrade and 900 volts bias with no dielectric breakdown of first dielectric layer 12.

A portion of second dielectric layer 29 can be removed, as indicated at 15, to permit a component part 16 (e.g., a circuit module) to be connected directly with the first electrically conductive circuit layer 13 (e.g., a secondary voltage circuit). Now, a connection is able to be made by a wire 17 from the component part 16 over to circuit line 18 of this second electrically conductive circuit layer 19.

The circuit lines indicated by the numerals 20a and 20b can be parts of the same circuit, or these can be completely different and separate circuits. It is illustrated in FIG. 1 that different component parts 21 and 22 can be connected to circuit lines 20b and 20a, respectively.

It is significant to note that the structural arrangement in accordance with the invention permits the electrical connections 23–28 to be made by reflow solder.

Referring next to FIG. 2, a different arrangement is illustrated by a circuit board identified generally by the numeral 30. One difference between board 30 and the board illustrated in FIG. 1 is that there is no second dielectric layer applied over the etched copper foil layer 37, since the voltage features and the signal circuit lines are contained in the same copper foil layer.

Circuit board 30 includes a carrier 31 formed of a suitable metal, such as copper, to function as a ground or common, while also functioning as a heatsink. A photoimageable dielectric material 32 is applied to the top surface of the carrier 31 and dried. A copper foil 37 of a required thickness is then applied to the dielectric material 32 in a lamination press using sufficient pressure to adhere the copper foil to the dielectric material. Importantly, the temperature during this lamination process is kept sufficiently low so as not to cure the dielectric material.

As done in FIG. 1, a desired circuit pattern is formed in the copper foil 37 using a conventional subtractive etching process. The dielectric material 32 is exposed to a required pattern that can include electrical interconnect vias 33 (filled with solder), thermal vias (not illustrated) and component mounting openings, such as illustrated by the numeral 34 for attaching a part 35 by solder 36, as needed for a particular circuit for which this board is made.

The circuit board 30 is processed through a solution to selectively remove portions of the dielectric material 32. Next, the board is subjected to a temperature for sufficient time to cure any dielectric material 32 that remains.

FIG. 3 illustrates a donut shaped configuration for a copper land 38, in accordance with the present invention, that permits the use of reflow solder to interconnect between circuit points or component parts (e.g., as in FIGS. 1 and 2) and metal carrier 31. A circuit line 39 connects any other desired component part or circuit point with the metal carrier 31, so that the advantages described above can be realized. A principal advantage of the donut shaped configuration for the copper land 38 is obtained through its use as an expose and develop mask during the dielectric removal process. By this means, the copper land 38 provides a self-aligned interconnect via structure.

Both of the circuit boards of the invention utilize a photo-imageable dielectric material that provides good strength against voltage breakdown, such as greater than 1250 volts per mil, so that the dielectric can be applied in a thin layer with good thermal dissipation characteristics.

An important feature in the manufacturing process described is that all interconnections are created without the need for drilling or copper plating. In other words, all interconnections, according to the present invention, are made with reflow solder as a part of the manufacturing process.

Also, if desired for a particular situation, an alternative to the subtractive etching process to form circuit lines can be utilized. A layer of a suitable dielectric material can be applied as an alternative to the use of copper foil and the subtractive etching processes that it requires. In this situation, such a dielectric layer must be photo-patterned, cured, have its surface roughened and plated with copper.

An electronic package produced in accordance with the present invention is effective in isolating voltages and has power (heat) dissipation capabilities that may eliminate need for an external heatsink. High density layer to layer and circuit point to point interconnections are made without a need for copper plating, drilling or other mechanical operations that typically increase both time and cost.

Carriers with thin dielectric layers as taught herein provide excellent thermal dissipation characteristics for heat generating components. Also, the use of dielectric material with selective removal characteristics allows such heat generating components to be attached directly to, or at least closer to, the metal carrier which then serves as a heatsink.

The compact arrangement of the invention, whether the card is a voltage boost card, an isolated voltage conversion card or other function requiring high heat dissipation, is enhanced substantially by the donut land configuration that permits the use of solder interconnections, thus reducing cost of manufacture. The donut land, of course, can be preformed and applied where needed either by heat or by solder, and the circuit line 39 can be in the form of a wire that is preformed with the donut land for connection as required.

The invention has been described in substantial detail. It is understood that changes and modifications can be made without departing from the spirit and scope of the invention which is set forth in the following claims.

What is claimed is:

1. An electronic circuit package comprising:
    a metal carrier having high thermal conductivity properties;
    a first dielectric layer comprised of a substantially cured resin glass material positioned on said metal carrier to provide electrical insulation;
    a first electrically conductive circuit layer positioned on said first dielectric layer;
    a second dielectric layer positioned on said first electrically conductive circuit layer and comprised of a substantially imaged photoimageable dielectric material including at least one via therein;
    a second electrically conductive circuit layer having a predetermined pattern positioned on said second dielectric layer; and
    at least one electrical interconnection between said first and second electrically conductive circuit layers, said electrical interconnection occurring through said via;
    wherein said first dielectric layer electrically insulates said metal carrier from said first and second electrically conductive layers and said electrical interconnection.

2. The electronic circuit package of claim 1 wherein said first electrically conductive circuit layer comprises electrical circuit features and a dielectric material disposed between said features.

3. The electronic circuit package of claim 1 wherein said at least one electrical interconnection comprises a quantity of solder.

4. The electronic circuit package of claim 1 wherein said first dielectric layer is less than about 0.004 inches for providing electrical insulation of at least about 2500 volts.

5. The electronic circuit package of claim 1 wherein said first dielectric layer has a breakdown strength of at least about 1250 volts per mil.

6. The electronic circuit package of claim 1 wherein said resin of said resin glass material is selected from the group consisting of epoxy, cyanate or bismaleimide resins.

7. The electronic circuit package of claim 6 wherein said resin is a bismaleimide resin, said bismaleimide resin including a free radical initiator.

8. The electronic circuit package of claim 7 wherein said free radical initiator is present in amounts up to about 0.5 percent by weight of said bismaleimide resin.

9. The electronic circuit package of claim 1 wherein said glass of said resin glass material is selected from the group consisting of organic woven fibers, organic non-woven fibers, inorganic woven fibers or inorganic non-woven fibers.

10. The electronic circuit package of claim 1 wherein said first dielectric layer has a thermal resistance of less than about 3 degrees Centigrade per Watt.

11. The electronic circuit package of claim 1 wherein said second dielectric layer has a breakdown strength of at least about 1250 volts per mil.

12. The electronic circuit package of claim 10 wherein said first dielectric layer has a thermal resistance of less than about 0.5 degrees Centigrade per Watt.

13. A method of making an electronic circuit package comprising the steps of:

providing a metal carrier having high thermal conductivity properties;

forming a first dielectric layer comprised of a substantially cured resin glass material positioned on said metal carrier to provide electrical insulation;

forming a first electrically conductive circuit layer positioned on said first dielectric layer;

forming a second dielectric layer positioned on said first electrically conductive circuit layer and comprised of a substantially imaged photoimageable dielectric material including at least one via therein;

forming a second electrically conductive circuit layer having a predetermined pattern positioned on said second dielectric layer; and forming at least one electrical interconnection between said first and second electrically conductive circuit layers through said via;

wherein said first dielectric layer electrically insulates said metal carrier from said first and second electrically conductive layers and said electrical interconnection.

14. The method of claim 13 wherein said step of forming said second dielectric layer on said first electrically conductive circuit layer comprises applying said photoimageable dielectric material on said first electrically conductive circuit layer and thereafter substantially imaging said photoimageable dielectric material.

15. The method of claim 13 wherein said step of forming said second electrically conductive circuit layer includes forming at least one donut shaped land.

16. The method of claim 15 wherein the step of defining said at least one via includes exposing the portion of said second dielectric layer around said at least one donut configured land to electromagnetic radiation and thereafter dissolving the unexposed portion of said second dielectric layer inside said at least one donut shaped land.

17. The method of claim 15 further comprising the step of attaching at least one component to said donut shaped land.

18. The method of claim 13 further comprising the step of forming said at least one electrical interconnection is accomplished by applying a quantity of solder within said at least one via and thereafter reflowing said solder.

* * * * *